United States Patent
Mitros et al.

(10) Patent No.: US 7,253,054 B2
(45) Date of Patent: Aug. 7, 2007

(54) ONE TIME PROGRAMMABLE EPROM FOR ADVANCED CMOS TECHNOLOGY

(75) Inventors: Jozef Czeslaw Mitros, Richardson, TX (US); David Tatman, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 247 days.

(21) Appl. No.: 11/058,881

(22) Filed: Feb. 16, 2005

(65) Prior Publication Data
US 2006/0183283 A1    Aug. 17, 2006

(51) Int. Cl.
*H01L 21/336* (2006.01)

(52) U.S. Cl. ............... 438/257; 257/E27.103; 257/E21.345; 257/E21.336; 257/E21.422

(58) Field of Classification Search ............ 438/257
See application file for complete search history.

(56) References Cited

U.S. PATENT DOCUMENTS

| | | |
|---|---|---|
| 5,394,101 A | 2/1995 | Mitros |
| 6,509,606 B1 * | 1/2003 | Merrill et al. ............ 257/321 |
| 6,882,009 B2 * | 4/2005 | Ker et al. ................. 257/349 |
| 6,887,758 B2 * | 5/2005 | Chindalore et al. ...... 438/257 |
| 7,144,795 B1 * | 12/2006 | Lines ........................ 438/527 |
| 2003/0228737 A1 * | 12/2003 | Efland et al. ............. 438/382 |
| 2004/0140497 A1 * | 7/2004 | Adams et al. ............ 257/315 |
| 2004/0235246 A1 | 11/2004 | Wu et al. |
| 2005/0045948 A1 * | 3/2005 | Springer ................... 257/342 |

OTHER PUBLICATIONS

U.S. Appl. No. 10/880,872, filed Jun. 30, 2004, Mitros.

* cited by examiner

*Primary Examiner*—Walter Lindsay, Jr.
*Assistant Examiner*—Thu-Huong Dinh
(74) *Attorney, Agent, or Firm*—Jacqueline L. Garner; W. James Brady, III; Frederick J. Telecky, Jr.

(57) ABSTRACT

A one time programmable (OTP) electrically programmable read only memory (EPROM) transistor (100) having an increased breakdown voltage (BVdss) is disclosed. The increased breakdown voltage reduces the probability that the OTP EPROM (100) will breakdown during a programming operation by maintaining a breakdown voltage above a programming voltage. The breakdown voltage is, at least partially, increased by forming a p-doped region (140) within a semiconductor substrate (102), and forming a drain region (166) of the OTP EPROM (100) within the p-doped region (140).

16 Claims, 4 Drawing Sheets

ONE TIME PROGRAMMABLE EPROM FOR ADVANCED CMOS TECHNOLOGY

FIELD OF INVENTION

The present invention relates generally to semiconductor devices and more particularly to forming a one time programmable (OTP) EPROM having an increased breakdown voltage.

BACKGROUND OF THE INVENTION

One time programmable (OTP) electrically programmable read only memory (EPROM) can be an effective, low cost mechanism for providing non-volatile memory in a variety of computer related applications, such as in small handheld digital devices like cellular telephones, personal digital assistants (PDAs), etc.

A relatively high voltage is, however, generally required to perform a programming operation in OTP EPROM. In particular, the high programming voltage has to be applied to the drain of a transistor device of the OTP EPROM. Such a high voltage may, however, exceed certain thresholds in some applications. In advanced complimentary metal oxide semiconductor (CMOS) applications, for example, the high programming voltage may exceed a breakdown voltage (BVdss) of the transistor device, which can induce a runaway current in the CMOS transistor based OTP EPROM, causing it to perform in an undesirable manner.

Accordingly, it would be desirable to have OTP EPROM with an increased drain junction breakdown voltage so that the OTP EPROM can be utilized (e.g., programmed) in advanced CMOS applications without experiencing a runaway current.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention relates to forming a one time programmable (OTP) electrically programmable read only memory (EPROM) having an increased drain junction breakdown voltage (BVdss). In particular, the drain junction breakdown voltage is increased above a programming voltage of the OTP EPROM so that the OTP EPROM can be programmed without instituting a resultant runaway current. The drain junction breakdown voltage is increased by establishing a p-type doped region near the drain region of a CMOS transistor of the OTP EPROM.

According to one or more aspects of the present invention, a method of forming a one time programmable (OTP) electrically programmable read only memory (EPROM) is disclosed. The method includes forming an n buried layer (NBL) within a semiconductor substrate and then forming an epitaxial layer over the substrate and the NBL. Left and right NWELL regions are formed within the epitaxial layer, and a p doped region is formed within the epitaxial layer between the left and right NWELL regions. A gate structure is then formed over the semiconductor substrate, and a source region and a drain region are formed in the semiconductor substrate adjacent to a left side of the gate structure and a right side of the gate structure, respectively. In so doing, the source region is at least partially formed within the left NWELL region and the drain region is at least partially formed within the p doped region.

In accordance with one or more other aspects of the present invention, a one time programmable (OTP) electrically programmable read only memory (EPROM) is disclosed. The one time programmable (OTP) electrically programmable read only memory (EPROM) can be formed as part of a CMOS fabrication process, and is formed upon a wafer having a silicon substrate. The one time programmable (OTP) electrically programmable read only memory (EPROM) includes left and right NWELL regions formed within at least some of an n buried layer (NBL) in an epitaxial layer formed over the semiconductor substrate. The OTP also includes a p doped region formed within the epitaxial layer between the left and right NWELL regions. Also, a gate structure is formed over the epitaxial layer, and a source region is formed adjacent to a left side of the gate structure within the left NWELL region, while a drain region formed adjacent to a right side of the gate structure within the p doped region.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

Figure 1:
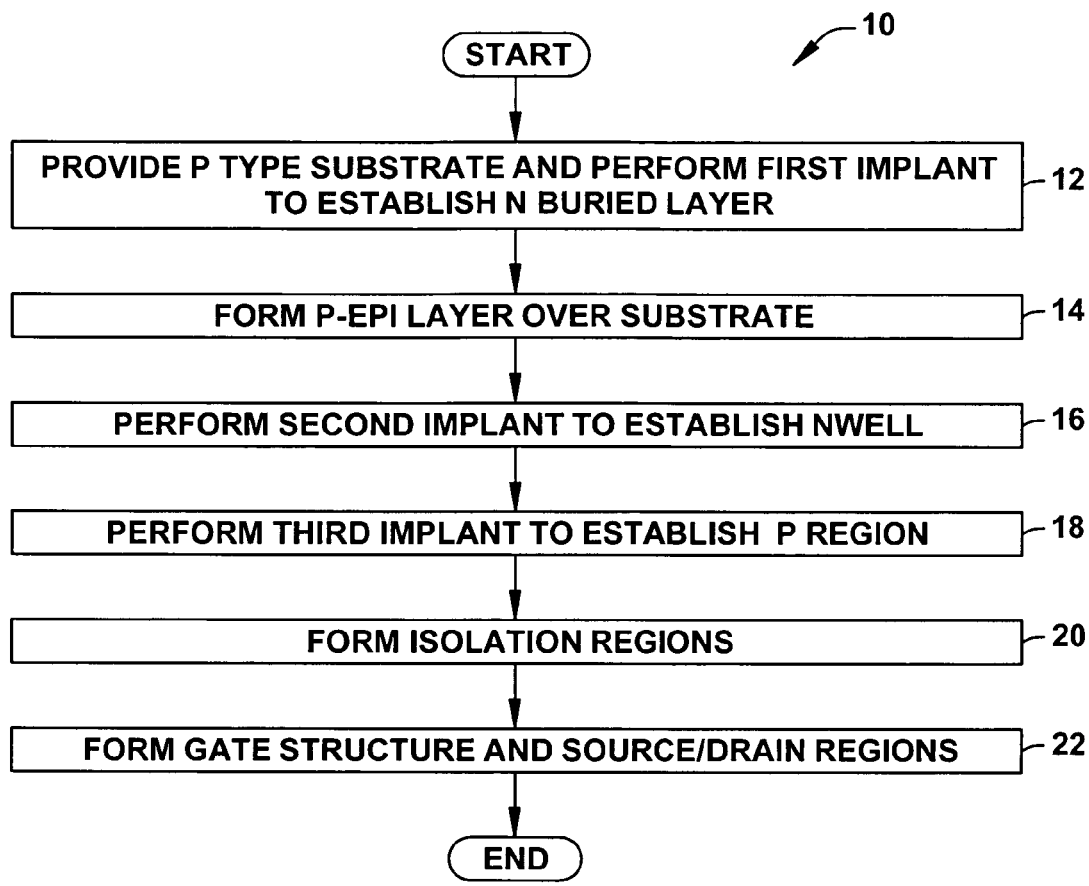
FIG. 1 is a flow diagram illustrating an exemplary methodology of forming a one time programmable (OTP) EPROM in accordance with one or more aspects of the present invention such that the OTP EPROM has an increased breakdown voltage.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, well-known structures and devices are shown in block diagram form in order to facilitate describing one or more aspects of the present invention.

One or more aspects of the present invention pertain to forming an OTP EPROM having an increase breakdown voltage, where the increase in breakdown voltage can be attributed, at least in part, to the presence of a p-type doped region near the drain region of a CMOS transistor of the OTP EPROM. FIG. 1 is a flow diagram illustrating an exemplary methodology 10 of forming an OTP EPROM according to one or more aspects of the present invention, and FIGS. 2-8 are cross sectional diagrams depicting an OTP EPROM 100 being formed according to an exemplary methodology, such as that illustrated in FIG. 1. Although the methodology 10 of FIG. 1 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated acts may be required to implement a methodology in accordance with one or more aspects of the present invention. Further, one or more of the acts may be carried out in one or more separate acts or phases.

It will be appreciated that a methodology carried out according to one or more aspects of the present invention may be implemented in association with the formation and/or processing of structures illustrated and described herein as well as in association with other structures not illustrated or described herein. By way of example, the method or variants thereof may be used to fabricate an OTP EPROM as illustrated and described below with respect to FIGS. 2-8, as well as to devices not shown or described with regard to the accompanying figures, and such figures are not intended to limit the scope of the present invention.

Figure 2:
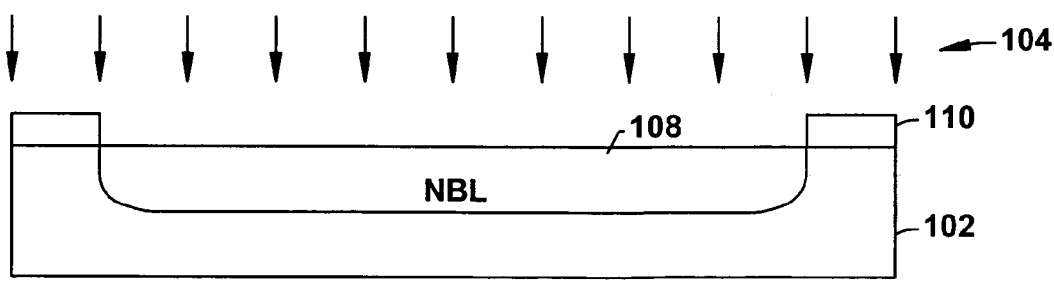
FIGS. 2-8 are fragmentary cross sectional diagrams illustrating the formation of an OTP EPROM that has an increased breakdown voltage according to one or more aspects of the present invention.
Figure 3:
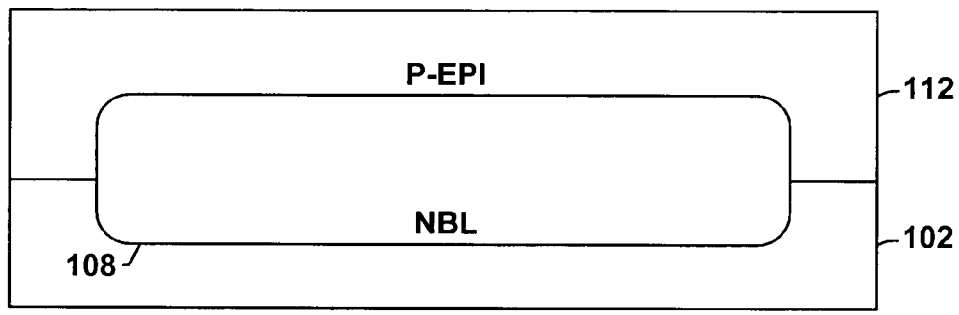

The methodology 10 begins at 12 wherein a semiconductor body or substrate 102 is provided and a first implantation process 104 of an n-type dopant is performed to establish an N buried layer (NBL) 108 within the substrate 102 (FIG. 2). The substrate 102 may, for example, possess a light p-type doping (e.g., of Boron (B)). Nevertheless, the term "substrate" as used herein is intended to include a semiconductor substrate, a semiconductor epitaxial layer deposited or otherwise formed on a semiconductor substrate and/or any other type of semiconductor body, and all such structures are contemplated as falling within the scope of the present invention. For example, the semiconductor substrate 102 may comprise a semiconductor wafer (e.g., silicon, SiGe, or an SOI wafer) and any epitaxial layers or other type semiconductor layers formed thereover or associated therewith. Although not illustrated, the (NBL) 108 may optionally be thermally diffused following the implantation process.

It will be appreciated that the NBL 108 is initially implanted or diffused in a prospective OTP EPROM transistor portion of the substrate 102, and that other n-buried layers (not shown) may be concurrently formed for use in other semiconductor devices, such as other transistors, etc. It will also be appreciated that any suitable processing techniques may be used in forming an n-buried layer 108 in a semiconductor body 102 within the scope of the invention, including but not limited to implantation, diffusion, etc., using any suitable process 104, implantation mask 110, and/or equipment, for example.

By way of example, as with all layers and/or features described herein (unless specifically indicated otherwise), n-buried layer 108 can, at least partially, be formed via lithographic techniques, where lithography generally refers to processes for transferring one or more patterns between various media. In lithography, a radiation sensitive resist coating is formed over one or more layers which are to be treated in some manner, such as to be selectively doped and/or to have a pattern transferred thereto. The resist, which is sometimes referred to as a photoresist, is itself first patterned by exposing it to radiation, where the radiation (selectively) passes through an intervening mask or template containing the pattern. As a result, the exposed or unexposed areas of the resist coating become more or less soluble, depending on the type of photoresist used. A developer is then used to remove the more soluble areas of the resist leaving a patterned resist. The pattered resist can then serve as a mask for the underlying layers which can then be selectively treated, such as to receive dopants and/or to undergo etching.

It will be appreciated that the n-type dopant of the NBL 108 is implanted in the substrate 102 at a dose (in atoms/cm$^2$) and at an associated energy (in keV). The degree of doping in this area (and in all such implanted areas) is thus, at least partially, dependent upon these parameters, as well as the duration of the implantation process 104. The dopant may, for example, be one or more n-type dopants such as Phosphorous (P), Arsenic (As) and/or Antimony (Sb) to establish the N buried layer (NBL) 108 within the semiconductor substrate 102. A dopant of Antimony can, for example, be implanted at a dose of between about 1.5E15/cm$^2$ and about 2.5E15/cm$^2$ at an energy level of between about 50 keV and about 70 keV to establish the NBL 108 within the semiconductor substrate 102.

A p-type epitaxial layer (P-EPI) 112 is then formed over the substrate 102 (FIG. 3) at 14. Layer 112 may, for example, be formed via epitaxial growth over the substrate 102. Such a P-EPI layer 112 can, for example, be deposited to a thickness of between about 1 to 25 microns. It will be appreciated that the P-EPI layer 112 may include a p-type dopant, such as Boron, for example. It will also be appreciated that due to the thermal conditions present during formation of the P-EPI layer (as well as other subsequent processing), the NBL region 108 may diffuse up into the P-EPI layer 112 (e.g., to between about 500 Angstroms and about 2 microns). By way of example, NBL diffusion may occur as a result of thermal cycling.

Figure 4:
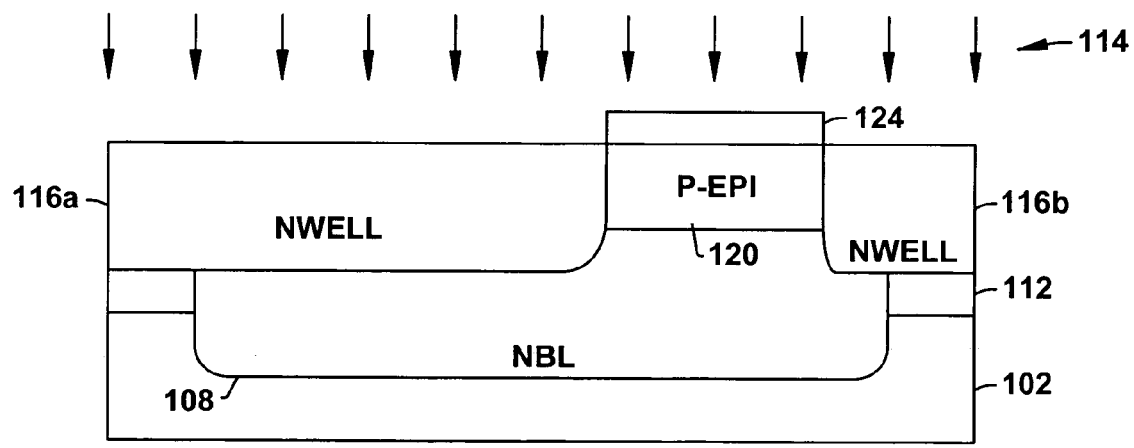
Figure 5:
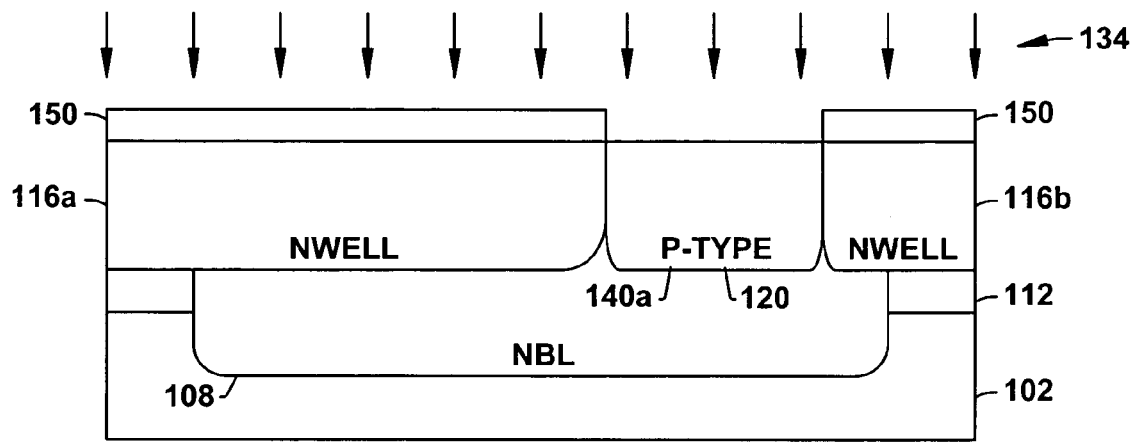
Figure 6:
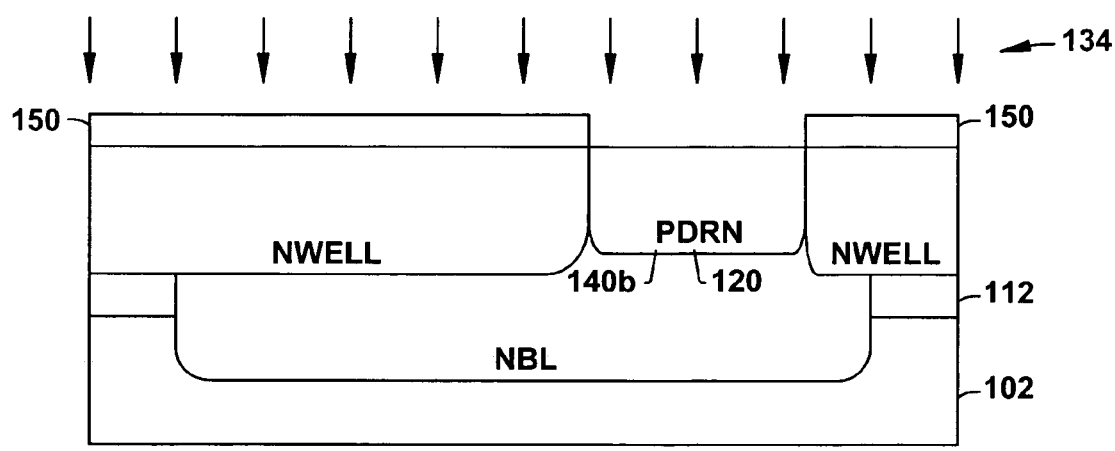

A second dopant implantation process 114 is then performed at 16 to establish a left and right NWELL regions 116a, 116b within the P-EPI layer 112 above the NBL region 108 (FIG. 4). The second implant is a lightly doped, high energy implant utilizing one or more n-type dopants such as Arsenic (As) and/or Phosphorous (P). Arsenic can, for example, be implanted at a dose of between about 3E11/cm$^2$ and about 5E12/cm$^2$ at an energy level of between about 25 keV and about 200 keV. Phosphorous (e.g., P31) can similarly be implanted at a dose of between about 1.8E12/cm$^2$ and about 5E13/cm$^2$ at an energy level of between about 200 keV and about 1000 keV, for example. Additionally, the NWELL regions 116a, 116b can also be subjected to heat treatment to activate the dopant and achieve a desired junction depth and doping concentration.

The left and right NWELL regions 116a, 116b are separated by a region 120 of the P-EPI 112 that does not receive the n-type dopant. A patterned layer of masking material 124 can, for example, be used to shield the EPI region 120. This layer (as with any and all other such layers described herein) can include any suitable material and/or combination of materials that can be patterned to facilitate a subsequent selective doping. For example, this second masking layer 124 can include a photo-resist material, an oxide material and/or a dielectric material formed via a spin-on and/or other type(s) of processes. Additionally, (as with any and all other such layers described herein) this patterned layer 124 can be removed or stripped subsequent to its intended use, such as via acid washing, for example.

A third implantation process 134 is then performed at 18 to form a p doped region 140 in the region 120 of the EPI layer 112 situated between the left and right NWELL regions 116a, 116b. This implanted region 140 may, for example, correspond to a PWELL region 140a (FIG. 5) or a PDRN region 140b (FIG. 6), as each of these types of regions are generally formed as part of a baseline CMOS fabrication process and thus can be readily implemented in a standard CMOS process. A PWELL implant can be a single or multiple implant process and utilize a p-type dopant such as Boron, for example. In one example, Boron (e.g., B11) can be implanted as a dose of between about $5E12/cm^2$ and about $5E13/cm^2$ at an energy level of between about 15 keV and about 600 keV to achieve a desirable PWELL doping profile. To form a PDRN region 140b, a p-type dopant, such as Boron can, for example, be implanted at a somewhat lighter dose of between about $1.1E13/cm^2$ and about $2.1E13/cm^2$ at an energy level of between about 450 keV and about 550 keV. It will be appreciated that a mask 150 can be used in this implantation process 134, and that this process can be followed by additional thermal processing.

Figure 7:
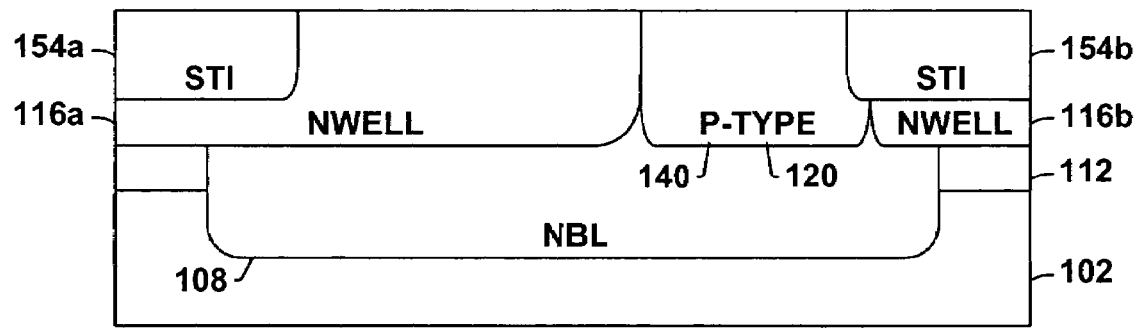

At 20 in FIG. 1, isolation regions are then formed in the substrate 102. More particularly, left and right isolation regions 154a, 154b are formed in the EPI layer 112 in the illustrated example. The left and right isolation regions 154a, 154b are respectively formed in the left and right NWELL regions 116a, 116b using any suitable techniques, such as shallow trench isolation (STI), local oxidation of silicon (LOCOS), deposited oxide, etc. (FIG. 7). In the illustrated example, the right isolation region 154b also extends slightly into a right side of the p doped region 140. To form field oxide (FOX) structures, for example, surface portions of the EPI layer 112 are selectively removed (e.g., masked and etched) and allowed to oxidize. Such oxidation may occur, for example, at between about 850 degrees Celsius and about 1200 degrees Celsius in the presence of steam in the span of between about 30 minutes and about 600 minutes. The select isolation areas 154a, 154b can be, for example, between about 4000 to about 7000 Angstroms in thickness.

A gate structure 160 and source and drain regions 164, 166 are then formed at 22 (FIG. 8), after which silicide, metallization, and/or other back-end processing (not shown) can be performed. To form the gate structure 160, a thin gate oxide 170 is formed over the upper surface of the epitaxial layer 112. The gate oxide 170 can be formed by any suitable material formation process, such as thermal oxidation processing, for example. By way of example, the oxide layer 170 can, for example, be formed to a thickness of between about 50 Angstroms and about 500 Angstroms at a temperature of between about 800 degrees Celsius and about 1000 degrees Celsius in the presence of $O_2$. The layer of oxide material 170 serves as a gate oxide in a high voltage CMOS device. Alternatively, a gate oxide associated with a low voltage CMOS device (e.g., having a thickness of about 70 Angstroms or less) may be employed.

A gate polysilicon layer 172 is then deposited over the thin gate oxide 170. The polysilicon layer 172 can, for example, for formed to between about 1000 to about 5000 Angstroms, and may include a dopant, such as a p-type dopant (Boron) or n-type dopant (e.g., Phosphorus). The dopant can be in the polysilicon 172 as originally applied, or may be subsequently added thereto (e.g., via a doping process). The gate oxide 170 and gate polysilicon 172 layers are patterned to form the gate structure 160. The gate structure 160 is situated over a channel region 174 formed within part of the left NWELL region 116a and part of the p region 140.

Figure 8:
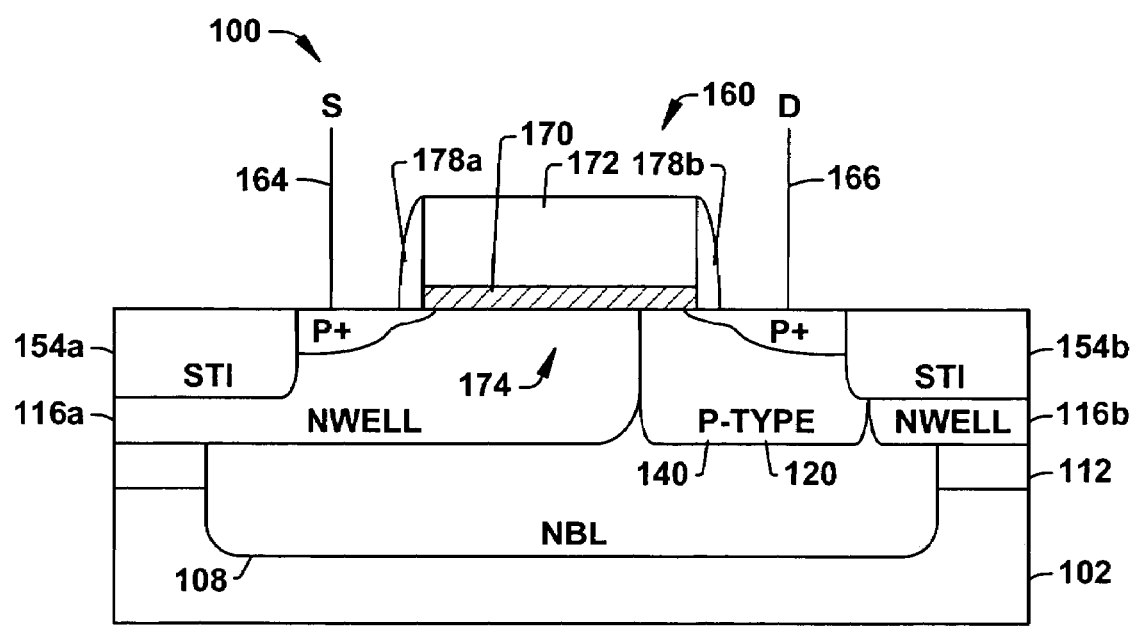

With the patterned gate structure formed, LDD, MDD, or other extension implants (not shown) can be performed, for example, and left and right sidewall spacers 178a, 178b can be formed along left and right lateral sidewalls of the patterned gate structure 160, respectively, as shown in FIG. 8. Implants to form the source (S) region 164 within the left NWELL region 116a and the drain (D) region 166 in the p region 140 are then performed, wherein any suitable masks and implantation processes may be used in forming the source and drain regions 164, 166. For example, a PMOS source/drain mask may be utilized to define one or more openings through which a p-type source/drain implant (e.g., Boron (B and/or $BF_2$)) is performed to form p-type source and drain regions 164, 166 (as in the illustrated example). Similarly, an NMOS source/drain mask may be employed to define one or more openings through which an n-type source/drain implant (e.g., Phosphorous (P) and/or Arsenic (As)) is performed to form n-type source and drain regions 164, 166. Such implants may also, for example, be effective to dope the poly-silicon 172 of the gate 160. It will be appreciated that the channel region 174 is thus defined between the source and drain regions 164, 166.

The final OTP EPROM transistor 100 can thus produced in an efficient and cost effective manner as part of an existing or baseline CMOS fabrication process. The increased concentration of p-type dopants within region 140 serves to increase the breakdown voltage (BVdss) of the OTP transistor by providing an increased electrical barrier—or potential—that electrons, or rather a stream of electrons (i.e., current), have to "break through" or "overcome" to establish a runaway current between the drain 166 and the source 164. By way of example, the breakdown voltage may be increased to between about negative 10 volts and about negative 19 volts, where the voltage required to program the OTP EPROM in advanced CMOS applications is merely between about negative 7 volts and about negative 9 volts. In this manner, the OTP EPROM can be programmed while the likelihood that the transistor will "break-down" remains extremely low.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and/or the claims, such terms are intended to be inclusive in a manner similar to the term "comprising." It is also to be appreciated that elements and/or layers depicted herein are illustrated with particular dimensions relative to one another (e.g., layer to layer dimensions and/or orientations) for purposes of simplicity and ease of understanding, and that the actual dimensions of such elements/layers may differ substantially from that illustrated herein. Also, the term "exemplary" is merely meant to mean an example, rather than "the best". Further, it is also to be appreciated that the ordering of the acts described herein can be altered and that any such re-ordering is contemplated as falling within the scope of one or more aspects of the present invention. For example, p region 140 can be formed prior to forming NWELL regions 116a, 116b.

What is claimed is:

1. A method of forming a one time programmable (OTP) electrically programmable read only memory (EPROM) transistor, comprising:

forming an n buried layer (NBL) within a semiconductor substrate;
   forming an epitaxial layer over the substrate and the NBL;
   forming left and right NWELL regions within the epitaxial layer;
   forming a p doped region within the epitaxial layer between the left and right NWELL regions;
   forming a gate structure over the semiconductor substrate; and
   forming a source region and a drain region in the semiconductor substrate adjacent to a left side of the gate structure and a right side of the gate structure, respectively, such that the source region is at least partially formed within the left NWELL region and the drain region is at least partially formed within the p doped region.

2. The method of claim 1, wherein a channel region is defined between the source and drain regions, and is established in at least some of the left NWELL region and the p doped region.

3. The method of claim 2, further comprising:
   forming left and right isolation regions within the left and right NWELL regions, respectively.

4. The method of claim 3, where the right isolation region also extends over a right side of the p doped region slightly.

5. The method of claim 2, wherein at least some of the NBL diffuses up into the epitaxial layer such that at least some of the left and right NWELL regions and at least some of the p doped region are formed in at least some of the NBL.

6. The method of claim 5, wherein the p doped region comprises a PWELL region.

7. The method of claim 5, wherein the p doped region comprises a PDRN region.

8. The method of claim 2, wherein the OTP EPROM is formed as part of a CMOS fabrication process.

9. The method of claim 2, wherein the OTP EPROM has a breakdown voltage (BVdss) of between about negative 10 volts and about negative 19 volts.

10. The method of claim 9, wherein the OTP EPROM has a program voltage of between about negative 7 volts and about negative 9 volts.

11. The method of claim 2, wherein forming the NBL comprises:
    implanting a dopant of Antimony at a dose of between about 1.5E 15/cm$^2$ and about 2.5E15/cm$^2$ at an energy level of between about 50 keV and about 70 keV.

12. The method of claim 6, wherein forming the p doped region comprises:
    implanting a dopant of Boron at a dose of between about 5E12/cm$^2$ and about 5E13/cm$^2$ at an energy level of between about 15 keV and about 600 keV.

13. The method of claim 12, wherein the epitaxial layer is deposited to a thickness of between about 1 to 25 microns.

14. The method of claim 7, wherein forming the p doped region comprises:
    implanting a dopant of Boron at a dose of between about 1.1 E13/cm$^2$ and about 2.1 E13/cm$^2$ at an energy level of between about 450 keV and about 550 keV.

15. The method of claim 2, wherein the OTP EPROM has a breakdown voltage (BVdss) of between about negative 10 volts and about negative 19 volts.

16. The method of claim 9, wherein the OTP EPROM has a program voltage of between about negative 7 volts and about negative 9 volts.

* * * * *